United States Patent [19]
Watts

[11] Patent Number: 5,006,808
[45] Date of Patent: Apr. 9, 1991

[54] TESTING ELECTRICAL CIRCUITS

[75] Inventor: Vivian C. Watts, Lydiard Way, United Kingdom

[73] Assignee: Bath Scientific Limited, Wiltshire, United Kingdom

[21] Appl. No.: 397,612

[22] Filed: Aug. 22, 1989

Related U.S. Application Data

[63] Continuation-in-part of Ser. No. 326,697, Mar. 21, 1989, abandoned.

[51] Int. Cl.$^5$ .................................. G01R 31/02
[52] U.S. Cl. ............................ 324/537; 324/158 F
[58] Field of Search ............... 324/61 R, 61 P, 73 PC, 324/537, 658, 679, 691, 705, 718, 158 F

[56] References Cited

U.S. PATENT DOCUMENTS

| | | | |
|---|---|---|---|
| 3,975,680 | 8/1976 | Webb | 324/158 R |
| 4,186,338 | 1/1980 | Fichtenbaum | 324/537 |
| 4,229,693 | 10/1980 | Irick et al. | 324/158 F |
| 4,417,204 | 11/1983 | Dehmel et al. | 324/73 PC |
| 4,565,966 | 1/1986 | Burr et al. | 324/158 F |
| 4,583,042 | 4/1986 | Reimer | 324/158 F |
| 4,785,235 | 11/1988 | Hendricks et al. | 324/537 |

Primary Examiner—Reinhard J. Eisenzopf
Assistant Examiner—Maura K. Regan
Attorney, Agent, or Firm—Nilsson, Robbins, Dalgarn, Berliner, Carson & Wurst

[57] ABSTRACT

A method of testing for short circuits between networks of a printed circuit board comprising a plurality of such networks comprises measuring an impedance value between each of the networks and a ground plane of the board, using a pair of probes; and, also using the probes, effecting tests for short circuits only between any two networks for which the measured impedance value is substantially the same and for which this measured impedance value is greater than a predicted lowest impedance for the two networks to be short-circuited together.

11 Claims, 3 Drawing Sheets

1

TESTING ELECTRICAL CIRCUITS

REFERENCE TO RELATED APPLICATIONS

This application is a continuation-in-part application of U.S. Ser. No. 07/326,697 filed Mar. 21, 1989, now abandoned and entitled TESTING ELECTRICAL CIRCUITS.

BACKGROUND OF THE INVENTION

The present invention relates to testing electrical circuits.

In the field of testing printed circuit boards, for example such boards before they have components added, it is known to test for open or short circuit faults in conductive tracks by making resistance value checks or capacitance value checks. Such checks may be made using at least one electrical testing probe, automatically controlled by a computer system to contact the board at appropriate points to make appropriate measurements.

Printed circuit boards may comprise a very large number of conductive tracks, forming a large number of networks, and it is necessary to know if there are undesired short circuits between such networks. For a printed circuit board having N such networks, the number of resistance based measurements required to verify that no undesired short circuit electrical paths exist between any two networks is:

$$N(N-1)/2$$

This is explained as follows. First, the resistance between a first network and every other network is measured, meaning a first number (N − 1) of measurements. Then, the resistance between a second network and every other network (except the first) is measured, meaning a second number ((N − 1) − 1) of measurements. Then, the resistance between a third network and every other network (except the first and second) is measured, meaning a third number ((N − 1) − 2) of measurements, and so on until the Nth network. The total number of measurements as a result of this is a series represented as above.

For a printed circuit board with a thousand networks, making resistance measurements between all networks as above would mean substantially half a million measurements and if, as is typical, the measurements are made using electrical testing probes, this would result in an extremely long test duration. A means of reducing the number of measurements in testing for short circuits between networks would clearly be an advantage.

To reduce the number of probe movements, U.S. Pat. No. 4,565,966 (Burr, et al) discloses a method and apparatus for testing a circuit board using a combination of capacitance measurements, between networks and a reference, and end-to-end resistance measurements of networks, the measured capacitance and resistance values being compared with respective pre-established values (obtained in a learning mode) for a board with no faults. There is also disclosed in Burr, et al a diagnostic routine for those networks which have been identified as being possibly faulty. More particularly, for those of the networks which have been identified as being possibly faulty and which have the same capacitance value in relation to the reference, inter-network resistance checks are carried out to check if any of them are short-circuited together, on the rationale that networks which have the same capacitance value in relation to the reference are likely to be short-circuited together. It would be possible to use such a routine for all the networks of a printed circuit board, by measuring the capacitance between each one of the networks and a reference, and carrying out tests for short circuits between pairs of networks which have the same capacitance value. However, this might result in too many short circuit tests being carried out than are actually necessary, since it is possible that two networks have the same capacitance value coincidentally and might not be actually short-circuited together.

SUMMARY OF THE INVENTION

According to the present invention from one aspect, there is provided a method of testing for short circuits between networks of an electrical circuit comprising a plurality of such networks, the method comprising measuring an impedance value between each of the networks and a reference; and effecting tests for short circuits only between any two networks for which the measured impedance value is substantially the same and for which this measured impedance value is greater than a predicted lowest impedance value for the two networks to be short-circuited together.

According to the present invention from another aspect, there is provided apparatus for use in testing an electrical circuit comprising a plurality of networks, the apparatus comprising: first means, for measuring an impedance value between each of the networks and a reference; and second means, whereby short circuits are tested for only between any two networks for which the measured impedance value is substantially the same and for which this measured impedance value is greater than a predicted lowest impedance value for the two networks to be short-circuited together.

Preferably, from the measured impedance values, a first value is calculated, for the lowest impedance per unit length of track, for a network comprising at least two points, and a second value is calculated, for the lowest impedance of a network which comprises just a single point, said first and second values being used to compute said predicted lowest impedance value for any two networks which have substantially the same impedance value, from a knowledge of geometrical characteristics of the two networks.

Said impedance value which is measured between each of the networks and a reference could comprise a capacitance value between each of the networks and a reference.

The impedance values which are measured could be stored in memory means which is scanned to identify those networks for which the measured impedance value is substantially the same.

Said tests for short circuits could be resistive tests.

DESCRIPTION OF THE PREFERRED EMBODIMENT

The operation of the embodiment to be described is such that the number of probe movements (and measurements) is reduced as compared with testing for short circuits between all networks on a printed circuit board but no prior knowledge is required of respective pre-established capacitance values in relation to a reference and pre-established end-to-end resistance values for the networks of a board with no faults.

Figure 1:
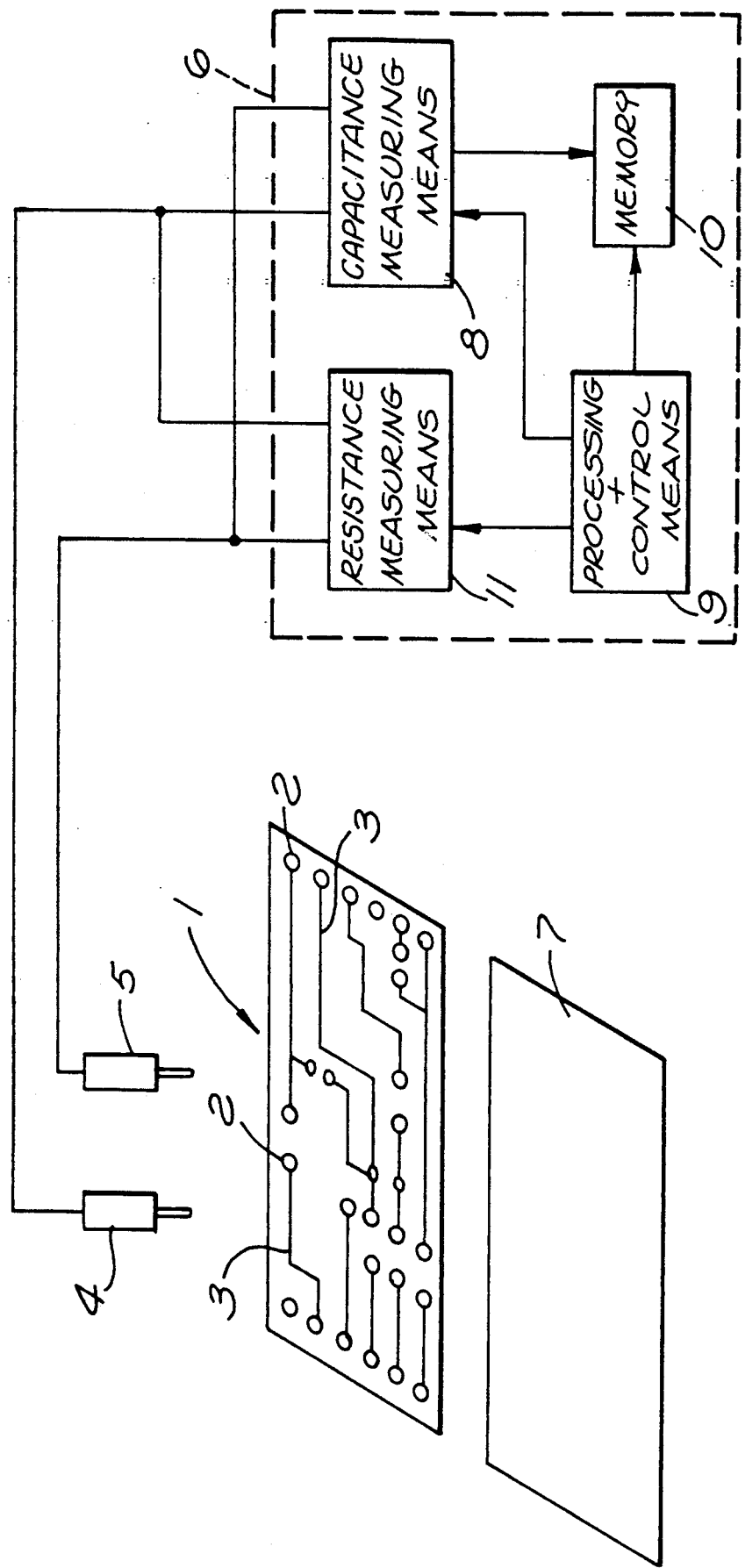
FIG. 1 is a schematic diagram of a preferred embodiment of apparatus according to the present invention.

Referring first to FIG. 1 of the accompanying drawings, reference numeral 1 designates (in fairly simple form for the sake of clarity), a printed circuit board to be tested before components are added, having terminal pads 2 and conductive tracks 3. Each terminal pad 2 is regarded as a single "point". The board has L individual networks including tracks 3, each such network comprising two or more points (terminal pads 2) interconnected by one or more conductive tracks 3. Also, there are M points (terminal pads 2) which do not have any conductive track connected to them and each such terminal pad is also considered as a "network" (i.e. a network which is regarded a single point, the networks comprising conductive tracks 2 being regarded as networks having two or more points). Thus the board 1 has a total of $L + M = N$ networks.

Reference numerals 4 and 5 designate electrical testing probes controlled via a computer system 6 and reference numeral 7 designates a conductive reference plane (which could be a ground plane of the circuit board 1). The probes 4 and 5 are each movable in the X, Y and Z directions relative to the board 1 under the control of the system 6 by suitable motors (not shown), as is known in the art.

First, using probe 4 to contact points on the circuit board 1 under the control of processing and control means 9 and with probe 5 in contact with the reference plane 7, the system 6 effects a measurement via capacitance measuring means 8 of a capacitance value between each of the networks of circuit board 1 and reference plane 7. There will be N such measurements and each measurement value is stored temporarily in a memory 10 with an indication of the network to which it relates.

Measuring means 8 could be of the type which measures the time taken to charge circuitry under test with a constant or semi-constant current between two specified voltage limits.

Figure 2:
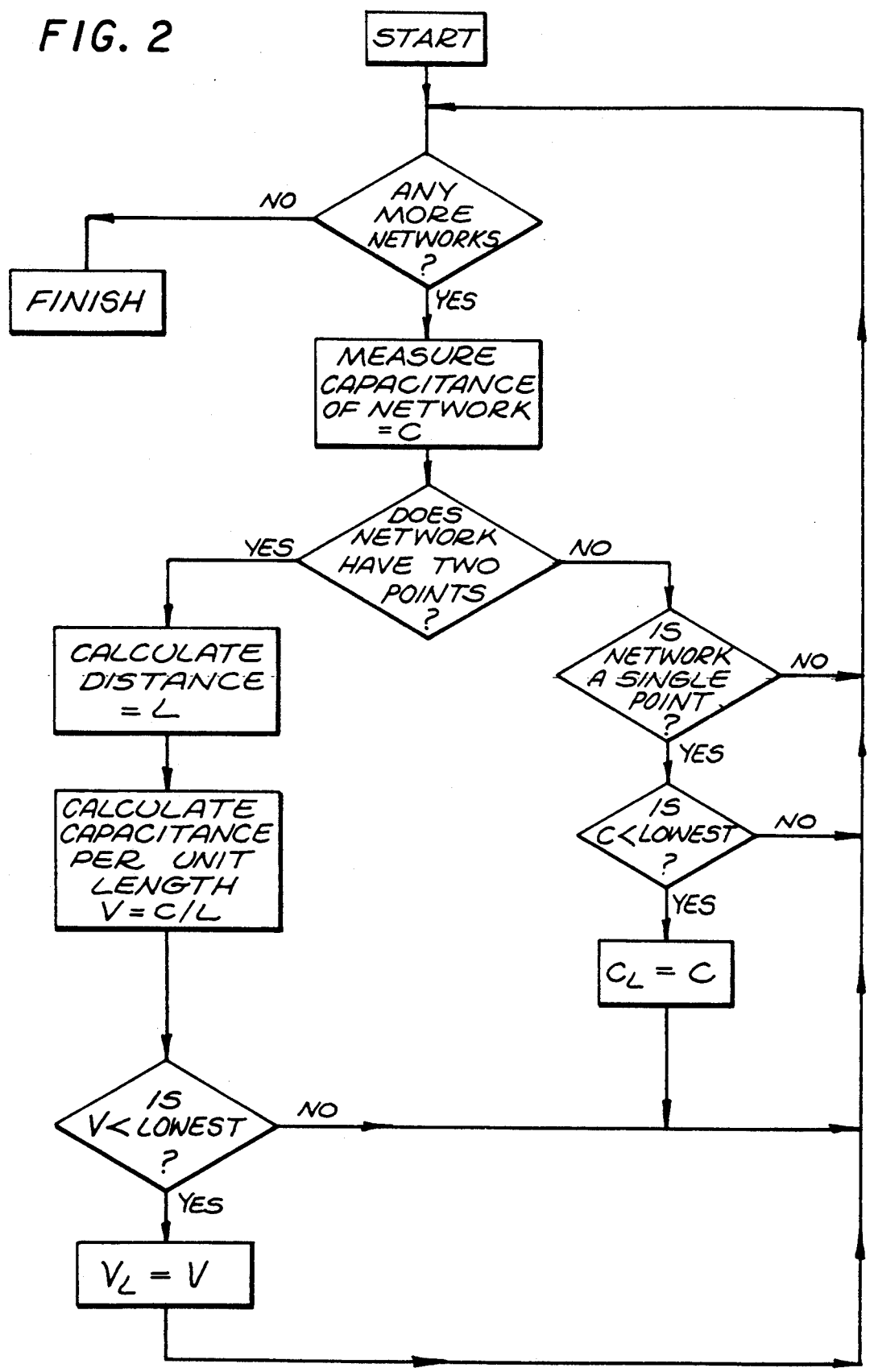
FIG. 2 is a flow chart for describing an operation of processing means of the embodiment.

While the measured capacitance values are being obtained, processing and control means 9 computes, from them and from its knowledge of the position(s) of the point(s) comprising each of the networks of the particular kind of board under test, a first value ($V_L$) which is regarded as the lowest capacitance per unit length of track for a network having at least two points and a second value ($C_L$) which is regarded as the lowest capacitance of a network which comprises only a single point. FIG. 2 is a flow chart describing the operation of processing and control means 9 in this respect. In the step in the flow chart labelled "CALCULATE DISTANCE=L" the value L which is calculated for a particular network having two or more points is derived from the knowledge of the geometrical nature and positions of the points of the particular network. More particularly, if the network comprises just a straight line of conductive track between two points (possibly having at least one intermediate point (terminal pad) along it), then L is calculated as the shortest distance between those two points; if the network comprises a line of conductive track between two points which is not a straight line and has no intermediate points (terminal pads) along it, then L is calculated as the distance of the straight line vector between the two points; if the network comprises a line of conductive track between two points which is not a straight line but has at least one intermediate point (terminal pad) along it, then L is calculated as the length of the track itself; and if the network comprises a line (straight or otherwise) between two points and at least one conductive track branching off it to at least one further point, then L is calculated as the shortest distance to travel along the network itself from one point to every other point of the network.

Having computed $V_L$ and $C_L$, the processing and control means 9 uses them as will be explained later below.

If there are no undesired short circuit faults between any two of the networks, the stored capacitance measurement values will in most cases all be different. However, if two networks have an undesired short circuit fault between them, then their capacitance values with reference to the ground plane 7 will be identical (although, in practice, the measured values stored in memory 10 will not be exactly identical due to physical measurement conditions, meaning that two or more stored measurement values will be regarded as being the "same" if they do not differ from each other by more than a certain amount). Accordingly, processing and control means 9 scans the values stored in memory 9 to identify each group of two or more than two networks which have the same measured capacitance value stored in memory 10, values being regarded as being the "same" if they do not differ from each other by more than a defined amount, for example if they do not differ by more than a small, defined percentage from each other. Any network whose measured capacitance value stored in memory 10 is different from that of every other network is regarded as being satisfactory and is not further tested. Each group of two or more networks having the same stored measured capacitance value comprises a group of candidates for testing for short circuits between the networks of the group. However, in any such group, the two networks or two of the networks might only have the same measured capacitance value coincidentally, not because they have an undesired short circuit between them. To reduce the number of tests for short circuits between networks having the same measured capacitance value, the control and processing means 9 identifies each network which, although having the same measured capacitance value as another, is not short-circuited to the other network since the measured capacitance value is less than a predicted lowest capacitance value for the two networks to be actually short-circuited together. Thus, tests for short circuits are only carried out between networks which are actually likely to be short-circuited together.

More particularly, for each two networks having the same measured capacitance value, the processing and control means 9 computes, from its knowledge of: the position(s) of the point(s) of each of the networks; the value of $V_L$ and/or $C_L$; and the shortest distance between the two networks, a predicted lowest capacitance value for each of them if they are actually short-circuited together, the rationale being that, if they are short-circuited together, then a conductive track exists between them.

The probability of a conductive track existing between two networks is small. The purpose of using the shortest distance between the networks is to ascertain if they are sufficiently close to justify testing for a short circuit at all. Thus, networks could be so far apart and result in such a high value of capacitance for a short circuit conductive track between them, that the predicted lowest capacitance value is higher than that measured in practice for each of the two networks, thereby to exclude these networks from being considered for a test for a short circuit between them.

More particularly, if each of the networks comprises a network having two or more points, then processing and control means 9 computes a capacitance value by multiplying $V_L$ by the value of L of each network respectively, and adding each resultant value to the value of the shortest distance between the two networks multiplied by $V_L$; if each of the networks comprises just a single point, then the processing and control means 9 adds $2 \times C_L$ to the shortest distance between the two points multiplied by $V_L$; and if the two networks comprise a network having two or more points and a network comprising a single point, then the processing and control means 9 multiples $V_L$ by the value of L for the network having two or more points, adds this to $C_L$ and adds the result to the shortest distance between the two networks multiplied by $V_L$.

As a result of the above, the processing and control means 9 computes, for each two networks which might be short circuited together, a predicted lowest capacitance value for them to be short-circuited together. The processing and control means 9 then compares the actual measured capacitance value of each network which might be short-circuited to another network with the predicted lowest capacitance value for the two networks being considered. If the measured value is less than the predicted lowest value, then the two networks are regarded as not being short-circuited together and are not further tested, whereas if the measured capacitance value is greater than the predicted lowest value, then the two networks are regarded as being possibly short-circuited together and are selected to be tested in this respect. Thus, the processing and control means 9 selects pairs of networks, in each of which pairs the networks have both the same measured capacitance value and a measured capacitance value which is greater than the predicted lowest capacitance value for the networks to be short-circuited together.

Figure 3:
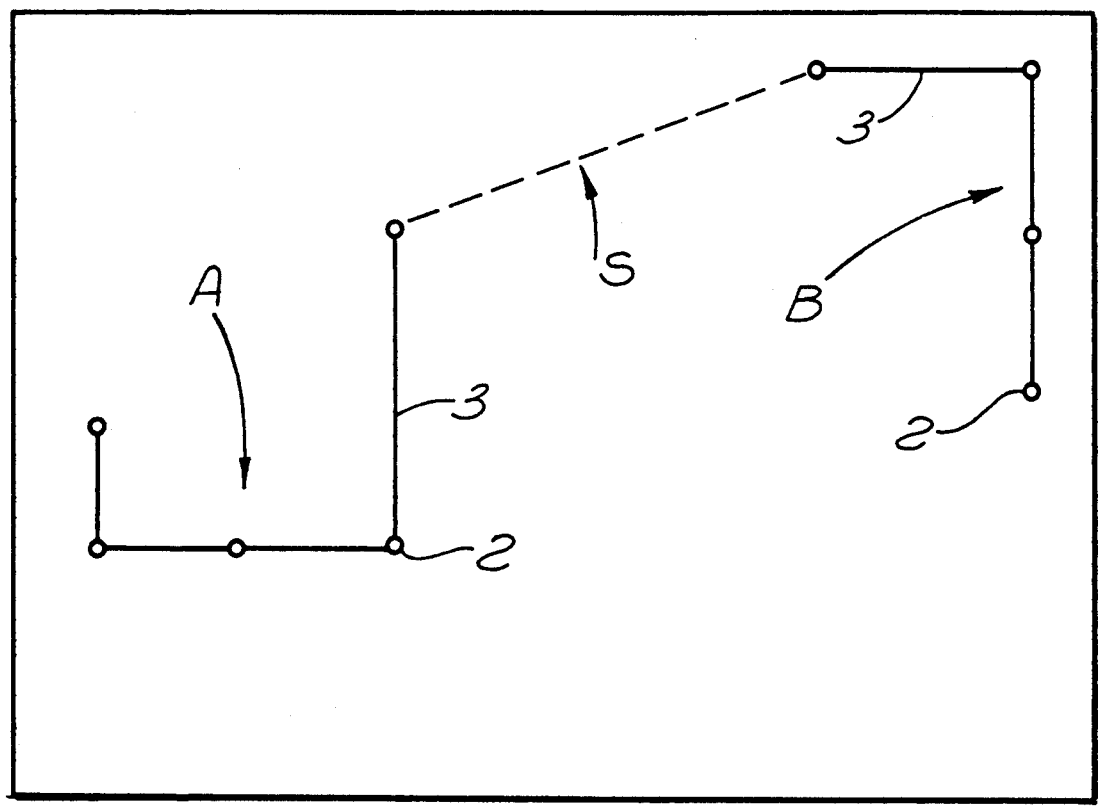
FIG. 3 is a diagram for use in explaining another operation of the processing means.

The above will be further described for explanatory purposes with reference to FIG. 3. If network A has a measured capacitance value of 100pF and network B has a measured capacitance value of 105pF, these two values will be regarded as the same by the processing and control means 9 and this could be due to a short circuit between them being present. Having previously calculated the lowest capacitance per unit length ($V_L$) of track and knowing the values of L for networks A and B, a theoretical lowest capacitance value can be calculated by processing and control means 9. In this case, assume that they are 40pF and 30pF respectively. The shortest distance between the two networks is represented by line S, which distance is the shortest possible length of a short circuit between the networks. By multiplying the length of line S by $V_L$ a calculated lowest capacitance value for a short circuit between the two networks is produced, and assume that it is 10pF.

Therefore the theoretical total cumulative capacitance of the two networks together with the short circuit is represented by $40+10+30=80$pF. Because the measured capacitance value of each of the networks A and B is greater than this theoretically lowest predicted value, then a test should be carried out to see if the two networks are short-circuited together. If, however, the theoretically lowest capacitance value for the two networks to be short circuited together had produced, for example, 300pF (for example because of the length of line S), then the two networks A and B would be excluded from being checked for a short circuit between them because their measured capacitance values are lower than the theoretically lowest predicted value for them to be short-circuited together.

In practice, the value of $V_L$ which is used is half the value obtained by the operation described with reference to FIG. 2, to cater for networks that cross over and for whom a resulting short circuit path can be considered zero and to err on the cautious side. Also, to err on the cautious side, the value of $C_L$ which is used is half the value obtained by the operation described with reference to FIG. 2.

For each two networks having the same measured capacitance value stored in memory 10, which value is greater than the predicted lowest capacitance value for them to be short-circuited together, resistive checks as outlined above are carried out, using the probes 4 and 5 under the control of the processing and control means 9, the system 6 including resistance measuring means 11 for this purpose. The resistance measuring means 11 could be means which indicate conductive continuity between two points, by testing to see if the resistance between the points is less than or greater than a certain threshold. For example, resistance measuring means 11 could supply a current from a constant current source between the points under test and compare the voltage dropped across the points with a threshold (for example the voltage dropped across a forward-biased diode) to test for continuity between the points.

In the light of the above, it will be appreciated that resistance measurements using probes 4 and 5 are only required for any two networks having the "same" capacitance value stored in memory 10 and for which this capacitance value is greater than a predicted lowest possible capacitance value for each of the two networks to be actually short-circuited together.

What is claimed is:

1. A method of testing for short circuits between networks of an electrical circuit comprising a plurality of such networks, the method comprising:
    (a) measuring an impedance value between each of the networks and a reference;
    (b) calculating, from the measured impedance values, (i) a first value, for the lowest impedance per unit length of track for a network comprising at least two points with at least one conductive track between them and (ii) a second value, for the lowest impedance of a network which comprises just a single point;
    (c) identifying, from the measured impedance values, any two of the networks which have substantially the same measured impedance value;
    (d) for any two such networks which have substantially the same measured impedance value, calculating a predicted lowest impedance value for those networks to be short-circuited together, using said first value and/or said second value, a knowledge of the geometrical characteristics of the two networks and their relative positions in the circuit; and (e) effecting tests for short circuits only between any two networks which have substantially the same measured impedance value and for which this measured impedance value is greater than the predicted lowest impedance value for the two networks to be short-circuited together.

2. A method according to claim 1, wherein the impedance value which is measured between each of the networks and a reference comprises a capacitance value between each of the networks and the reference.

3. A method according to claim 1, wherein the impedance values which are measured are stored in memory means which is scanned to identify those networks for which the measured impedance value is the same.

4. A method according to claim 1, wherein the tests for short circuits are resistive tests.

5. A method according to claim 1, wherein the electrical circuit is a printed circuit board.

6. A method according to claim 5, wherein said reference is a ground plane of the circuit board.

7. Apparatus for use in testing for short circuits between networks of an electrical circuit comprising a plurality of such networks, the apparatus comprising:

(a) means for measuring an impedance value between each of the networks and a reference;

(b) means for calculating, from the measured impedance values, (i) a first value, for the lowest impedance per unit length of track for a network comprising at least two points with at least one conductive track between them and (ii) a second value, for the lowest impedance of a network which comprises just a single point;

(c) means for identifying, from the measured impedance values, any two of the networks which have substantially the same measured impedance value;

(d) means for calculating, for any two such networks which have substantially the same measured impedance value, a predicted lowest impedance value for those networks to be short-circuited together, using said first value and/or said second value, a knowledge of the geometrical characteristics of the two networks and their relative positions in the circuit; and (e) means for testing for short circuits only between any two networks which have substantially the same measured impedance value and for which this measured impedance value is greater than the predicted lowest impedance value for the two networks to be short-circuited together.

8. Apparatus according to claim 7, wherein said measuring means comprises capacitance measuring means for measuring a capacitance value between each of the networks and the reference.

9. Apparatus according to claim 7, including memory means for storing the measured impedance values, said second means scanning the memory means to identify those networks for which the measured impedance value is the same.

10. Apparatus according to claim 7, wherein said testing means comprises resistance value testing means.

11. Apparatus according to claim 7, including at least two probe means movable with respect to the electrical circuit for use by said measuring means in measuring the impedance values and for use by said second means in testing for short circuits.

* * * * *